(12) United States Patent
Aguilar et al.

(10) Patent No.: US 9,698,036 B2
(45) Date of Patent: Jul. 4, 2017

(54) STACKED WAFER CASSETTE LOADING SYSTEM

(71) Applicant: Lam Research Corporation, Fremont, CA (US)

(72) Inventors: Silvia R. Aguilar, San Jose, CA (US); Scott Wong, Sunnyvale, CA (US); Derek J. Witkowicki, Newark, CA (US); Richard H. Gould, Fremont, CA (US); Candi Kristoffersen, San Jose, CA (US); Brandon Senn, Molalla, OR (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 14/933,987

(22) Filed: Nov. 5, 2015

(65) Prior Publication Data

US 2017/0133255 A1    May 11, 2017

(51) Int. Cl.
*H01L 21/677*    (2006.01)

(52) U.S. Cl.
CPC .... *H01L 21/67742* (2013.01); *H01L 21/6773* (2013.01); *H01L 21/67733* (2013.01); *H01L 21/67769* (2013.01); *H01L 21/67775* (2013.01); *H01L 21/67778* (2013.01)

(58) Field of Classification Search
CPC ......... H01L 21/67201; H01L 21/67775; H01L 21/67766; H01L 21/67742; H01L 21/6773; H01L 21/67733; H01L 21/67769; H01L 21/67778
See application file for complete search history.

(56) References Cited

U.S. PATENT DOCUMENTS

| | | | | |
|---|---|---|---|---|
| 7,419,346 B2 * | 9/2008 | Danna | ............... | H01L 21/67736 414/217 |
| 7,578,650 B2 * | 8/2009 | Aalund | ............. | H01L 21/67775 414/217 |
| 7,604,449 B1 * | 10/2009 | Kaveh | ............... | H01L 21/67201 414/411 |
| 7,661,919 B2 * | 2/2010 | Bonora | ............. | H01L 21/67727 414/222.01 |
| 8,043,039 B2 * | 10/2011 | Yamamoto | ........ | H01L 21/67766 414/217 |
| 8,287,222 B2 * | 10/2012 | Sawado | ............ | H01L 21/67724 414/279 |
| 8,348,584 B2 * | 1/2013 | Mizokawa | ........ | H01L 21/67775 414/225.01 |
| 8,702,365 B2 * | 4/2014 | Park | ................... | H01L 21/67769 414/217 |
| 8,851,819 B2 * | 10/2014 | Kamikawa | ........ | H01L 21/67727 414/222.07 |
| 8,882,433 B2 * | 11/2014 | Bonora | ............. | H01L 21/67766 414/331.03 |
| 8,944,739 B2 * | 2/2015 | Chen | ................... | H01L 21/6773 414/217 |

(Continued)

*Primary Examiner* — Kaitlin Joerger
(74) *Attorney, Agent, or Firm* — Beyer Law Group LLP (57) ABSTRACT

A substrate cassette loading system for docking substrate cassettes to a substrate processing system is provided. A plurality of ports passes substrates into the substrate processing system, wherein a first port of the plurality of ports is vertically above a second port of the plurality of ports. A plurality of cassette loaders provides substrate cassettes to the plurality of ports.

20 Claims, 13 Drawing Sheets

(56) References Cited

U.S. PATENT DOCUMENTS

| | | | |
|---|---|---|---|
| 8,985,937 B2* | 3/2015 | Fukutomi | H01L 21/67766 414/805 |
| 2008/0217268 A1* | 9/2008 | Yoshida | H01L 21/67766 211/41.18 |
| 2009/0067957 A1* | 3/2009 | Ando | B65G 37/02 414/222.05 |
| 2010/0003111 A1* | 1/2010 | Yeo | H01L 21/67775 414/222.07 |
| 2012/0051873 A1* | 3/2012 | Shibata | H01L 21/67775 414/222.01 |
| 2014/0286733 A1* | 9/2014 | Ogura | H01L 21/67775 414/217.1 |
| 2015/0110585 A1* | 4/2015 | Ota | H01L 21/67733 414/222.13 |
| 2016/0035607 A1* | 2/2016 | Lee | H01L 21/67294 414/304 |
| 2016/0172225 A1* | 6/2016 | Morikawa | H01L 21/67772 73/865.8 |

* cited by examiner

FIG. 8

STACKED WAFER CASSETTE LOADING SYSTEM

BACKGROUND

The present disclosure relates to the manufacturing of semiconductor devices. More specifically, the disclosure relates to the loading of wafers in a semiconductor processing system.

During semiconductor wafer processing, wafers in a cassette are loaded into a semiconductor processing system.

SUMMARY

To achieve the foregoing and in accordance with the purpose of the present disclosure, a substrate cassette loading system for docking substrate cassettes to a substrate processing system is provided. A plurality of ports provides a substrate pass through into the substrate processing system, wherein a first port of the plurality of ports is vertically above a second port of the plurality of ports. A plurality of cassette loaders provides substrate cassettes to the plurality of ports.

In another manifestation, a substrate cassette loading system for docking substrate cassettes to a substrate processing system is provided. A plurality of ports provides a substrate pass through into the substrate processing system, wherein a first port of the plurality of ports is vertically above a second port of the plurality of ports. A plurality of cassette loaders docks substrate cassettes to the plurality of ports with a first cassette loader of the plurality of cassette loaders, which docks substrate cassettes to the first port and a second cassette loader of the plurality of cassette loaders, which docks substrate cassettes to the second port. At least one cassette loader actuator moves either the first cassette loader or the second cassette loader, from a first position, where the first cassette loader is vertically aligned with the second cassette loader, to a second position where the first cassette loader is not vertically aligned with the second cassette loader.

In another manifestation, a method for loading substrate cassettes to a substrate processing system is provided. A plurality of ports is provided for providing a substrate pass through into the substrate processing system, wherein a first port of the plurality of ports is vertically above a second port of the plurality of ports. A plurality of cassette loaders is provided for docking substrate cassettes to the plurality of ports with a first cassette loader of the plurality of cassette loaders, which docks substrate cassettes to the first port, and a second cassette loader of the plurality of cassette loaders, which docks substrate cassettes to the second port. Substrate cassettes are loaded on the first cassette loader and the second cassette loader. Substrate cassettes are removed from the first cassette loader and the second cassette loader.

These and other features of the present disclosure will be described in more detail below in the detailed description of the disclosure and in conjunction with the following figures.

BRIEF DESCRIPTION OF THE DRAWINGS

The present disclosure is illustrated by way of example, and not by way of limitation, in the figures of the accompanying drawings and in which like reference numerals refer to similar elements and in which.

DETAILED DESCRIPTION OF THE PREFERRED EMBODIMENTS

The present disclosure will now be described in detail with reference to a few preferred embodiments thereof as illustrated in the accompanying drawings. In the following description, numerous specific details are set forth in order to provide a thorough understanding of the present disclosure. It will be apparent, however, to one skilled in the art, that the present disclosure may be practiced without some or all of these specific details. In other instances, well known process steps and/or structures have not been described in detail in order to not unnecessarily obscure the present disclosure.

Figure 1:
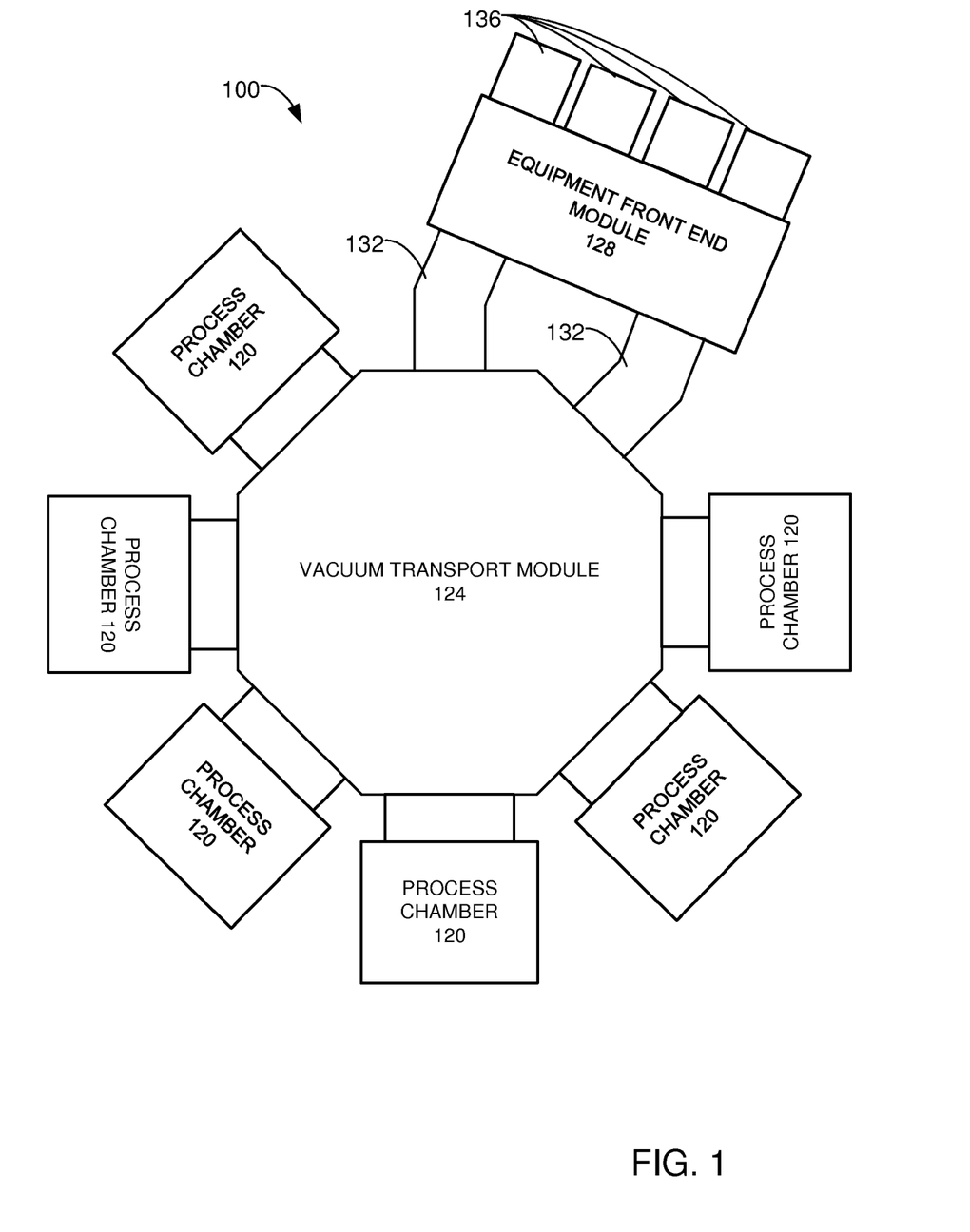
FIG. 1 is a top schematic view of a processing tool.

To facilitate understanding of an embodiment, FIG. 1 is a top schematic view of a processing tool 100 and which includes a plurality of processing chambers 120 connected to a vacuum transport module (VTM) 124, which is connected to an equipment front end module (EFEM) 128 by a pair of load locks 132. A plurality of cassette loaders 136 are connected to the EFEM 128. The cassette loaders 136 are used to load substrate cassettes, such as a wafer cassette, which may be a front opening unified pod (FOUP) into the EFEM 128. The load locks 132 provide a passage for transferring the substrate, such as a wafer, back and forth between the substrate cassettes at atmosphere in the EFEM 128 and a vacuum of the VTM 124. The VTM 124 transfers substrates to and from the processing chambers 120 and the load locks 132. The processing chambers 120 may provide the same process or different processes.

Figure 2A:
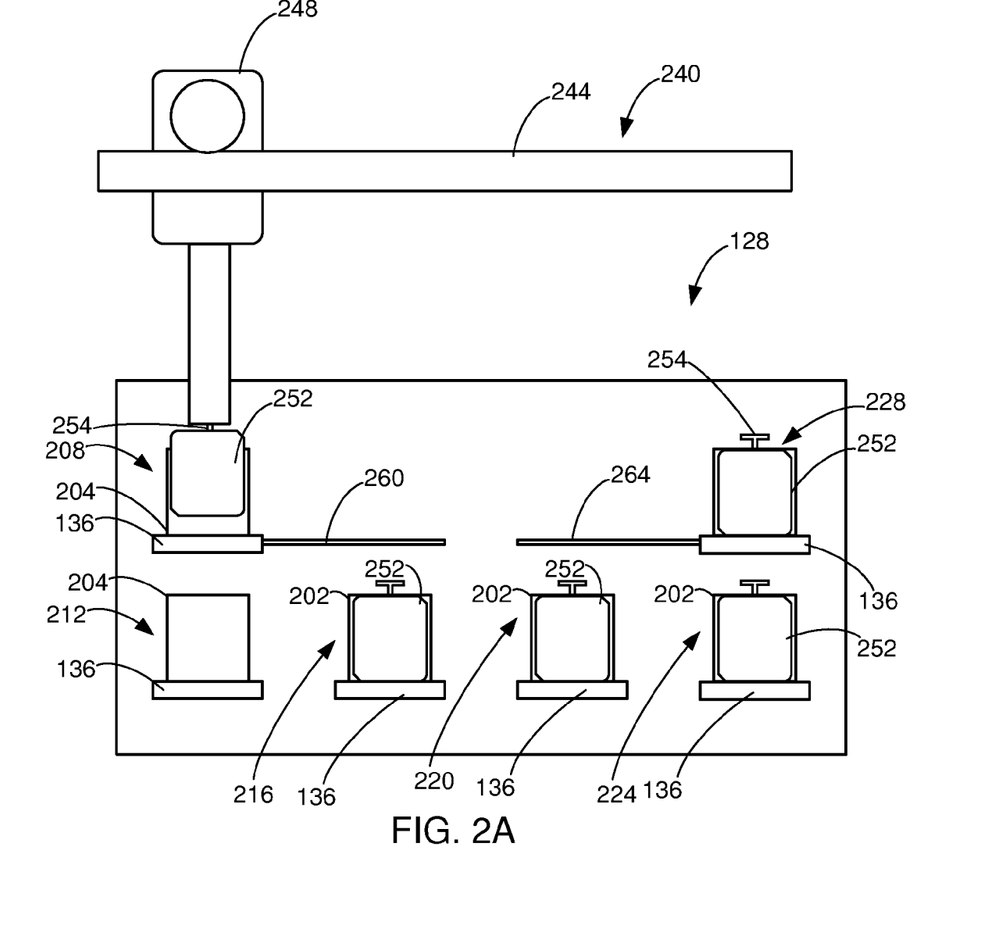
FIG. 2A and FIG. 2B are front views of an EFEM with a substrate cassette loading system for docking substrate cassettes to the EFEM.

FIG. 2A is a front view of the EFEM 128 with a substrate cassette loading system for docking substrate cassettes to the EFEM 128. The EFEM 128 has a plurality of ports, where each port comprises an aperture 202 large enough to allow passage of a substrate into the EFEM 128 and a door opener 204 covering the aperture. For ports were the door opener 204 is closed, the aperture 202 is not visible. For ports where the door opener 204 is opened, by extending the door opener 204 into the EFEM 128, the aperture 202 would be visible. In some embodiments, substrate cassettes are sealed to the EFEM and the aperture would not be visible. In this example, the door opener is opened only for ports where a substrate cassette 252 is docked to the port. In this embodiment, each substrate cassette 252 has a handle 254 for carrying the substrate cassette 252. In this example, the EFEM 128 comprises a first port 208, a second port 212, a third port 216, a fourth port 220, a fifth port 224, and a sixth port 228. Arrows are used to indicate a port, since the port comprises a door opener 204 and an aperture 202. As shown, the first port 208 is located vertically above the second port 212. In this example, the first port 208 is vertically aligned above the second port 212. The sixth port 228 is vertically above the second port 212 in that the sixth port 228 is vertically higher than the second port 212, however the sixth port 228 is not vertically aligned above the second port 212, because the sixth port 228 is horizontally displaced from being directly over the second port 212.

An overhead hoist transport system (OHT) 240 comprises a track 244 and an OHT car 248 for transporting and vertically placing a substrate cassette 252, using the handle 254. As shown, the location of the car 248 and the cassette loaders 136 allows the OHT 240 to place a substrate cassette 252 in a cassette loader 136 adjacent to the first port 208, wherein the cassette loader 136 adjacent to the first port 208, is associated with the first port 208, in that the cassette loader 136 adjacent to the first port 208 facilitates docking, providing, or loading a substrate cassette on the associated cassette loader 136 to the first port 208. The OHT 240 both loads a substrate cassette 252 with preprocessed substrates on the cassette loaders 136 and removes a substrate cassette 252 with processed substrates from the cassette loader 136. The OHT 240 moves the substrate cassettes 252 from and back to the dock. In this example, the loading system has a first actuator 260 for moving the cassette loader 136 adjacent to the first port 208 from being above the second port 212 to being above the third port 216. The loading system further comprises a second actuator 264 for moving the cassette loader 136 adjacent to the sixth port 228 from being above the fifth port 224 to being above the fourth port 220. As shown in FIG. 2A the loading system is in a first position.

Figure 2B:
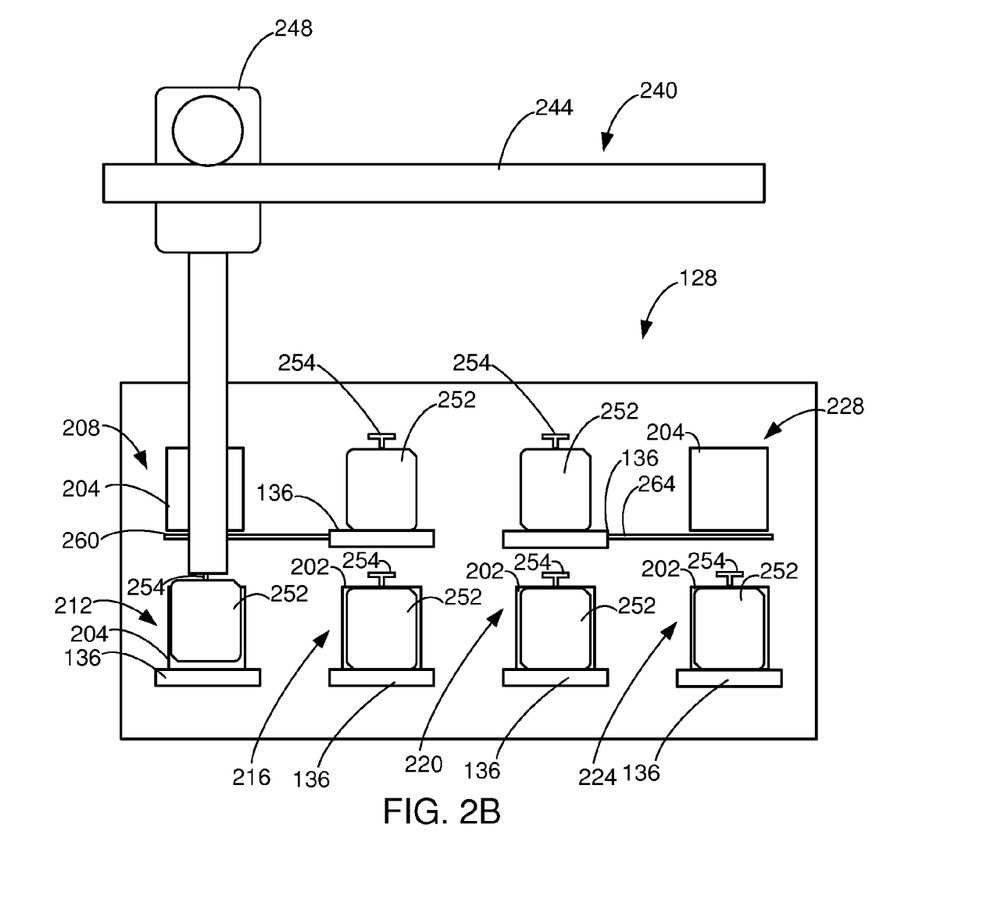

FIG. 2B is a front view of the EFEM 128 with a substrate cassette loading system for docking substrate cassettes to the EFEM 128, where the loading system is in a second position. In the second position, the cassette loader 136 that is associated to the first port 208, since it was adjacent to the first port 208 and is used for loading, providing, or docking a substrate cassette to the first port 208, is horizontally moved to be vertically aligned above the third port 216, and the cassette loader 136 that is associated to the sixth port 228, since it was adjacent to the sixth port 228 and is used for loading, providing, or docking a substrate cassette to the sixth port 228, is horizontally moved to be vertically aligned above the fourth port 220, as shown. In this second position, the OHT 240 is able to place a substrate cassette 252 on a cassette loader 136 adjacent to the second port 212. In this example, the OHT 240 does not need to move in order transition from loading the cassette loader 136 adjacent to the first port 208 to loading the cassette loader 136 adjacent to the second port 212.

This embodiment provides six ports which may simultaneously hold six substrate cassettes, where the footprint of the EFEM 128 is only about four substrate cassettes wide. This allows an increase in the number of substrate cassettes that may be simultaneously handled, without increasing the footprint of the processing tool 100 and without changing the OHT.

To address particle concerns of packaging upper load port mechanism above docked substrate cassettes at lower load ports, an exhausted particle trap is provided to the assembly to prevent particle contamination of substrates.

Figure 3A:
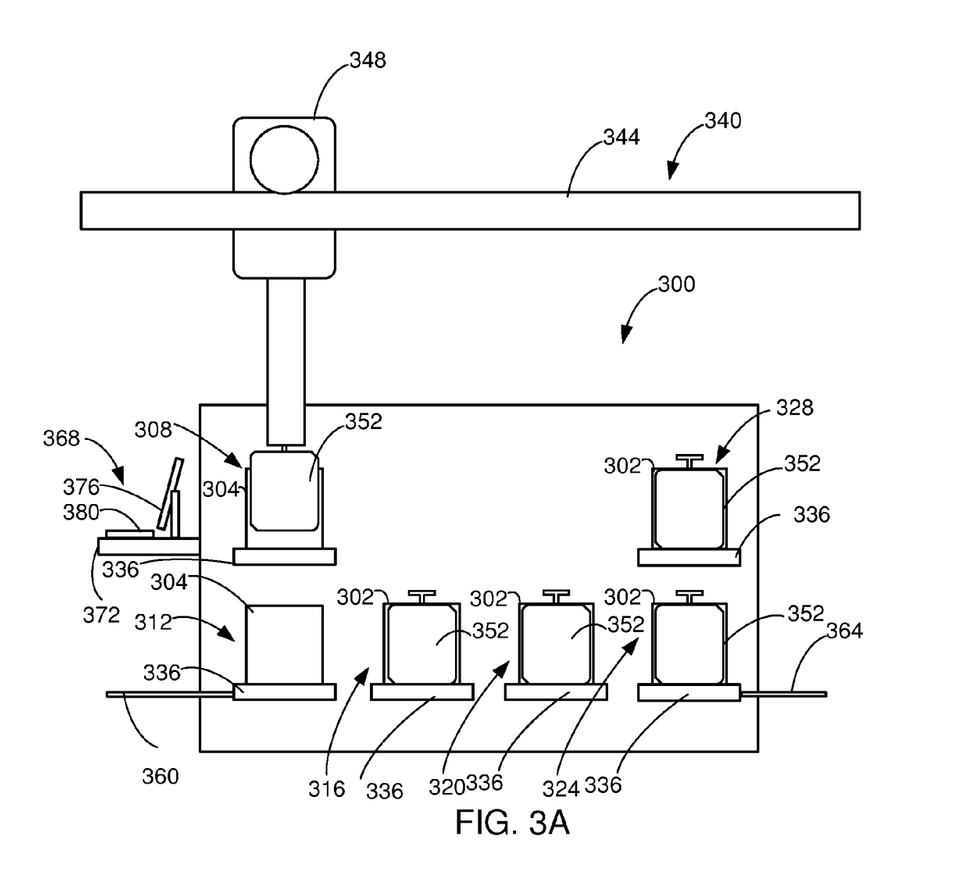
FIG. 3A and FIG. 3B are front views of an EFEM with a substrate cassette loading system for docking substrate cassettes to the EFEM in another embodiment.

FIG. 3A is a front view of an EFEM 300 in another embodiment with a substrate cassette loading system for docking FOUPs to the EFEM 300. The EFEM 300 has a plurality of ports, where each port comprises an aperture 302 large enough to allow passage of a substrate into the EFEM 300 and a door opener 304 covering the aperture when a substrate cassette is not docked to the port. In this example, the EFEM 300 comprises a first port 308, a second port 312, a third port 316, a fourth port 320, a fifth port 324, and a sixth port 328. Arrows are used to indicate the port, since the port comprises a door opener 304 and an aperture 302. As shown, the first port 308 is located vertically above the second port 312. In this example, the first port 308 is vertically aligned above the second port 312.

An overhead hoist transport system (OHT) 340 comprises a track 344 and an OHT car 348 for transporting and vertically placing a FOUP 352. As shown, the location of the car 348 and the cassette loaders 336 allows the OHT 340 to place a FOUP 352 in a cassette loader 336 adjacent to the first port 308. The OHT 340 both loads a FOUP 352 with preprocessed substrates on the cassette loaders 336 and removes a FOUP 352 with processed substrates from the cassette loader 336. In this example, the loading system has a first actuator 360 for moving the cassette loader 336 adjacent to the second port 312 from being below the first port 308 to a side of the EFEM 300. The loading system further comprises a second actuator 364 for moving the cassette loader 336 adjacent to the fifth port 324 from being below the sixth port 328 to a side of the EFEM 300. As shown in FIG. 3A the loading system is in a first position.

In this embodiment a control panel 368 or other features are on at least one side of the EFEM 300, making the width of the footprint of the EFEM wider. In this example, the control panel 368 comprises a shelf 372, a monitor 376, and a keyboard 380.

Figure 3B:
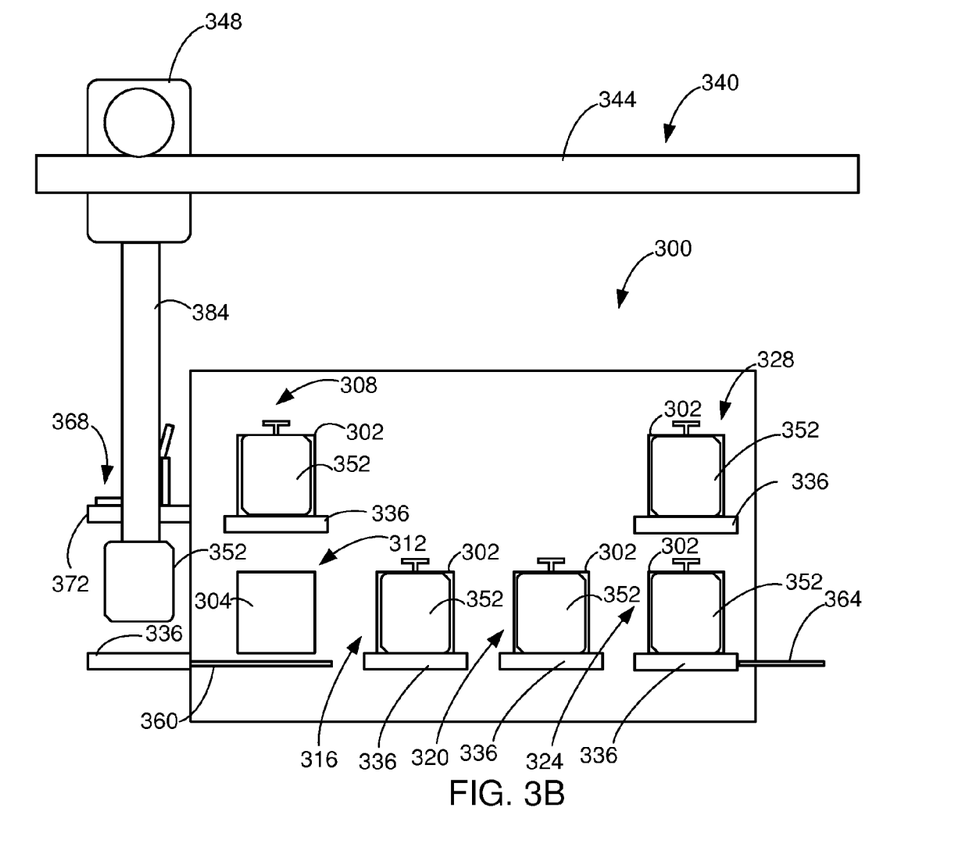

FIG. 3B is a front view of the EFEM 300 with a substrate cassette loading system for docking FOUPs to the EFEM 300, where the loading system is in a second position. In the second position, the cassette loader 336 that is associated to the second port 312, since it was adjacent to the second port 312 and is used for loading, providing, or docking a FOUP to the second port 312, is horizontally moved to a side of the EFEM 300 near the control panel 368, as shown. The OHT car 348 has been moved to be over the cassette loader 336 associated with the second port 312. In this second position, the OHT 340 is able to place a FOUP 352 on a cassette loader 336 associated with the second port 312. In this example, the OHT 340 is moved to a second position in order to transition from loading the cassette loader 336 associated to the first port 308 to loading the cassette loader 336 associated to the second port 312. In this example, the control panel 368 is behind the OHT arm 384.

Figure 4A:
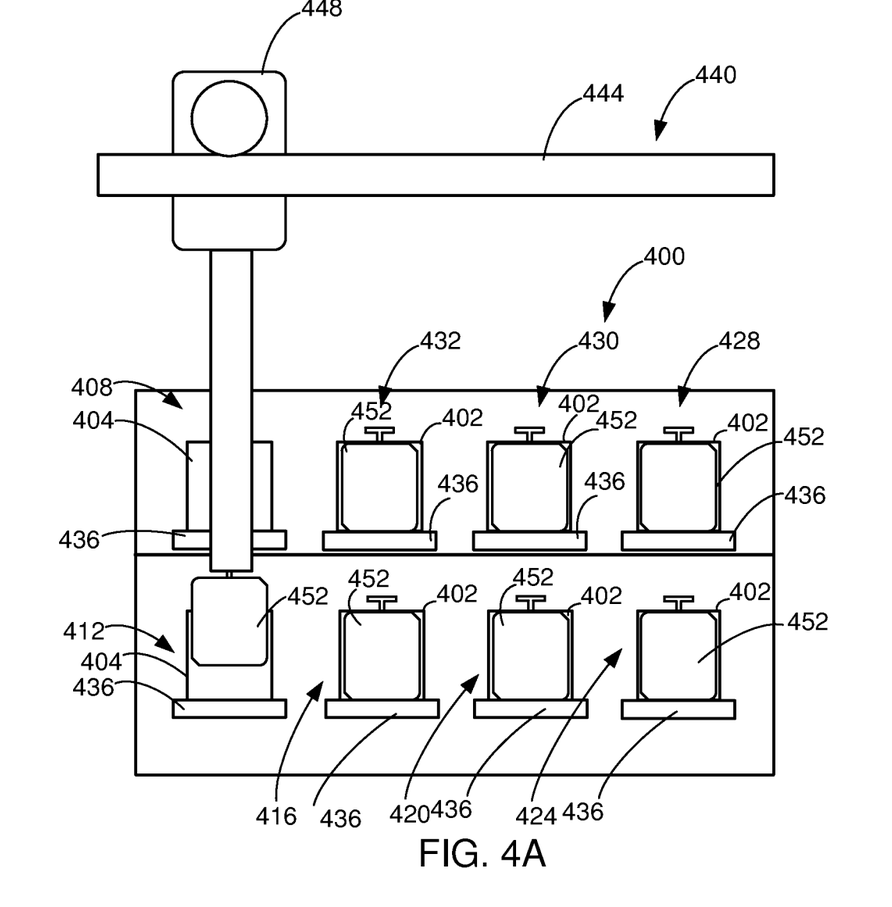
FIG. 4A and FIG. 4B are front views of an EFEM with a substrate cassette loading system for docking substrate cassettes to the EFEM in another embodiment.

FIG. 4A is a front view of an EFEM 400 in another embodiment with a substrate cassette loading system for docking substrate cassettes to the EFEM 400. The EFEM 400 has a plurality of ports, where each port comprises an aperture 402 large enough to allow passage of a substrate into the EFEM 400 and a door opener 404 covering the aperture 402. In this example, the EFEM 400 comprises a first port 408, a second port 412, a third port 416, a fourth port 420, a fifth port 424, a sixth port 428, a seventh port 430, and an eighth port 432. Arrows are used to indicate the port, since the port comprises a door opener 404 and an aperture 402.

An overhead hoist transport system (OHT) 440 comprises a track 444 and an OHT car 448 for transporting and vertically placing a FOUP 452. As shown, the location of the car 448 and the cassette loaders 436 allows the OHT 440 to place a FOUP 452 in a cassette loader 436 adjacent to the second port 412. The OHT 440 both loads a FOUP 452 with preprocessed substrates on the cassette loaders 436 and removes a FOUP 452 with processed substrates from the cassette loader 436. As shown in FIG. 4A the loading system is in a first position.

Figure 5A:
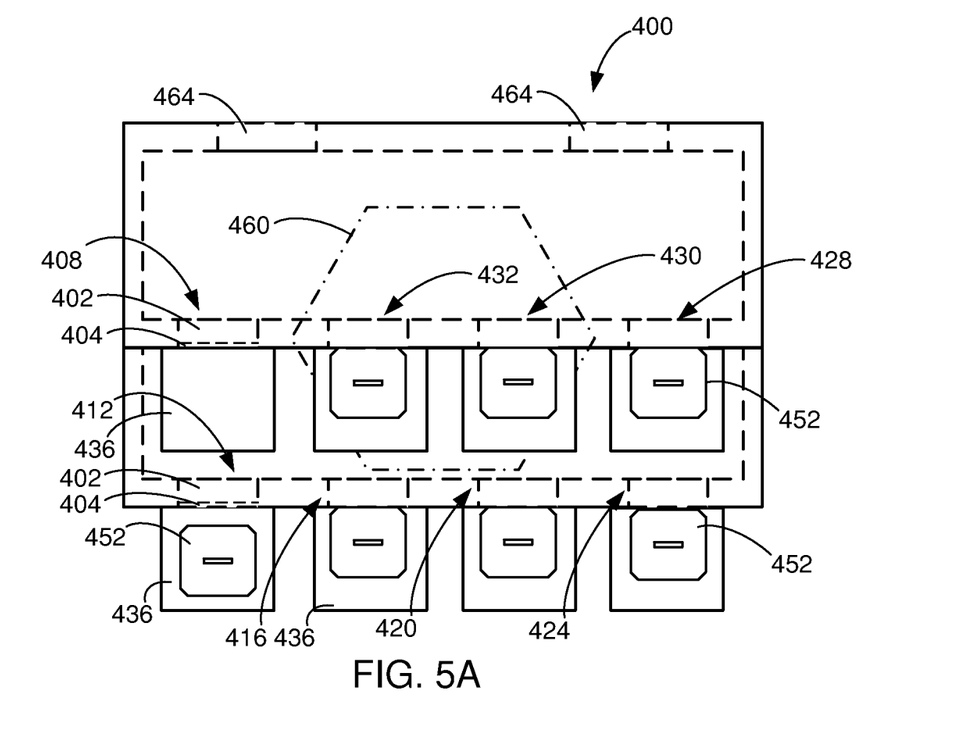
FIG. 5A and FIG. 5B are top views of the EFEM with the substrate cassette loading system, shown in FIG. 4A and FIG. 4B.
Figure 6A:
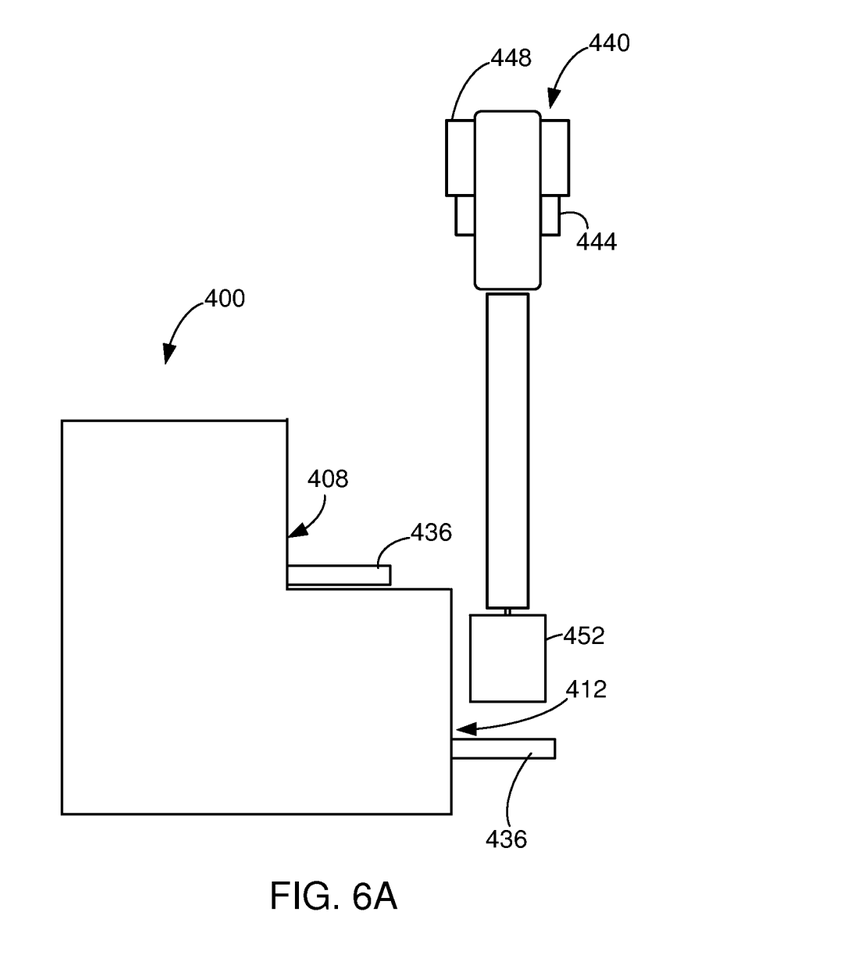
FIG. 6A and FIG. 6B are side views of the EFEM with the substrate cassette loading system, shown in FIG. 4A and FIG. 4B.

FIG. 5A is a top view of the EFEM 400 of the embodiment illustrated in FIG. 4A. FIG. 6A is a side view of the EFEM 400 of the embodiment illustrated in FIG. 4A. FIG. 5A and FIG. 6A show that the top row of the first, sixth, seventh, and eighth ports 408, 428, 430, 432 are vertically above the bottom row of the second, third, fourth, and fifth ports 412, 416, 420, 424 and are displaced closer to the back of the EFEM 400 than the bottom row of ports. As shown in FIG. 6A the OHT 440 is positioned to provide a substrate cassette 452 to the cassette loader 436 adjacent to the second port 412.

Figure 4B:
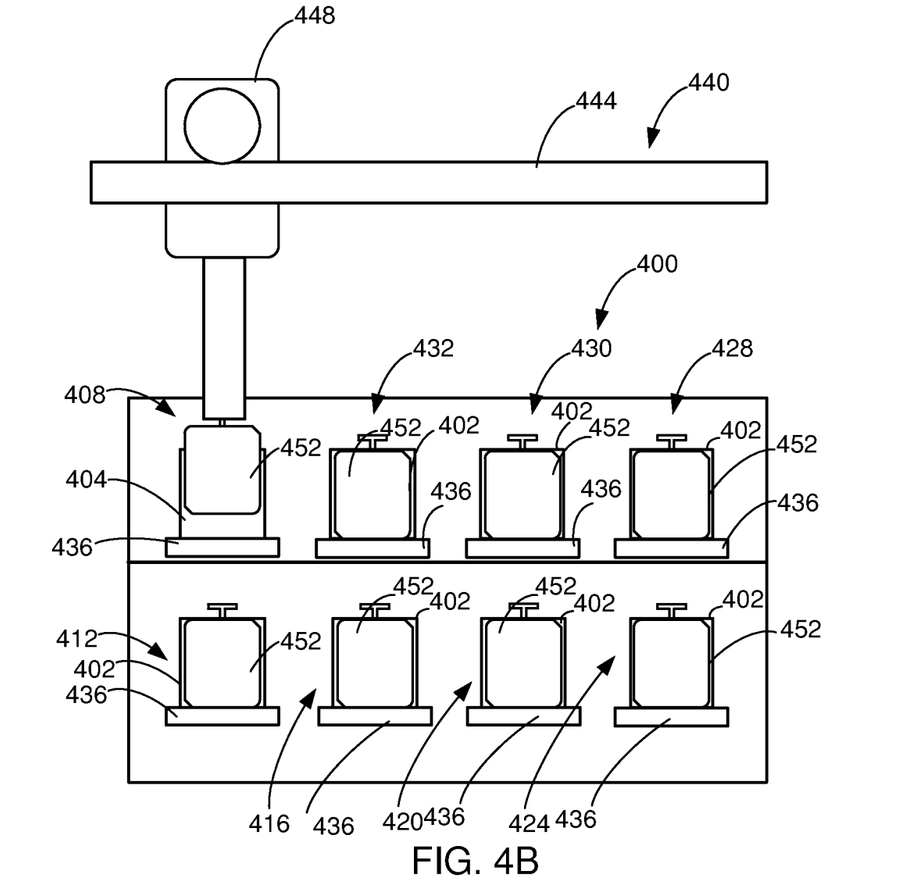
Figure 5B:
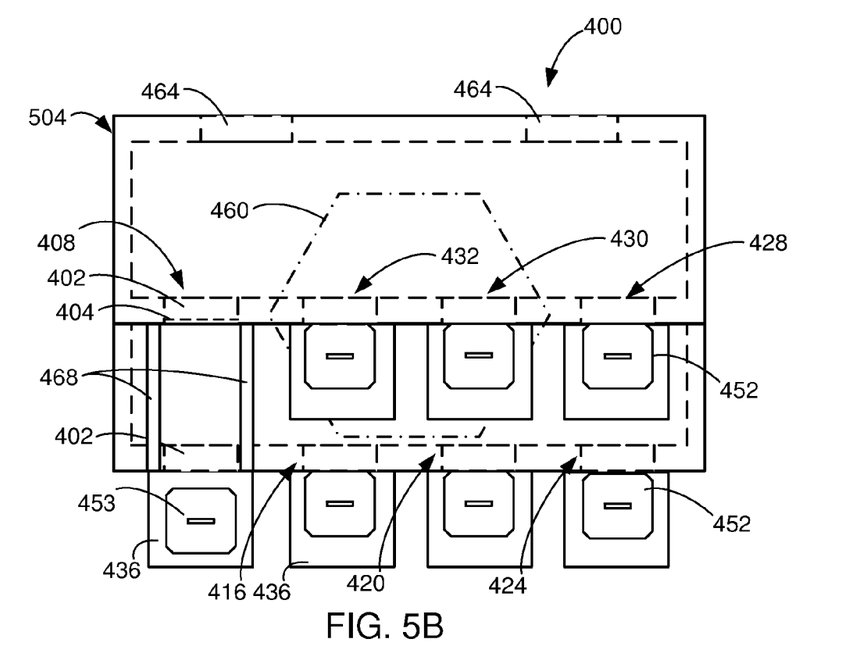
Figure 6B:
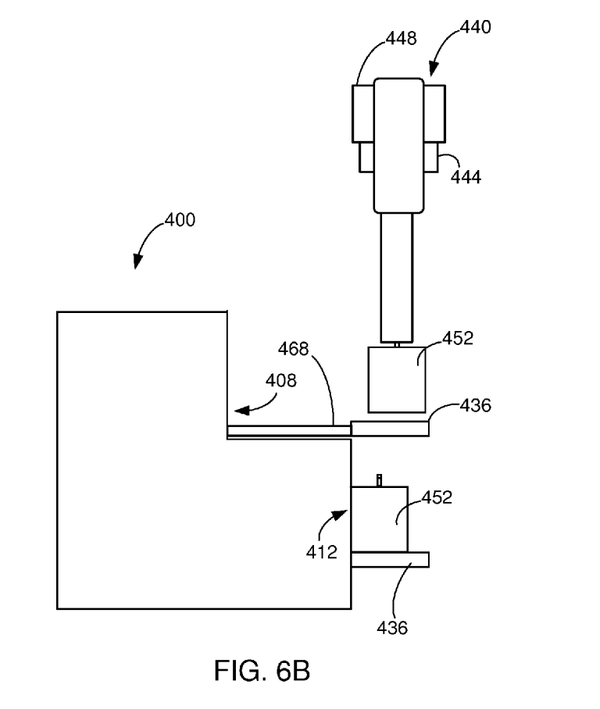

FIG. 4B is a front schematic view of the EFEM 400 placed in a second position. FIG. 5B is a top view of the EFEM 400 placed in the second position. FIG. 6B is a side view of the EFEM 400 placed in the second position. An actuator 468 moves the cassette loader 436 associated with the first port 408 from being adjacent to the first port 408, as shown in FIG. 5A and FIG. 6A to a position above the cassette loader 436 adjacent to the second port 412, as shown in FIG. 5B and FIG. 6B. The OHT 440 is able to deposit a substrate cassette 452 on the cassette loader 436, which transports the substrate cassette 452 to the first port 408, so that the substrate cassette 452 may be docked to the first port 408. In this embodiment, there as many ports in the upper row as there are ports in the lower row.

FIG. 5B also shows inner features, shown with dashed lines. FIG. 5B shows the first port 408, with the aperture 402 shown in dashed lines as passing through the walls 504 of the EFEM 400. Although the walls 504 of the EFEM 400 may only be sheet metal, in FIG. 5B the thickness of the wall 504 may not be drawn to scale in order to more clearly illustrate how the apertures 402 pass through the wall 504. Since a substrate cassette 452 is not docked to the first port 408 the door opener 404 is closed. For the other ports, since a substrate cassette 452 is docked, the doors are extended into the EFEM 400 so that the doors are not visible. The robot 460, housed inside the EFEM 400, is able to access substrates at different vertical levels from the different vertical heights of the ports and is able to transfer substrates to and from various ports.

In another embodiment, instead of the top row being closer to the back of the EFEM, the top row and bottom row are in the same plane so that the top row is vertically aligned with the bottom row. In such a configuration, the cassette loaders for each port would move forward to vertically align with the OHT. Such an embodiment may have additional rows, since a cassette loader from any row may be moved to be positioned under the OHT.

Figure 7:
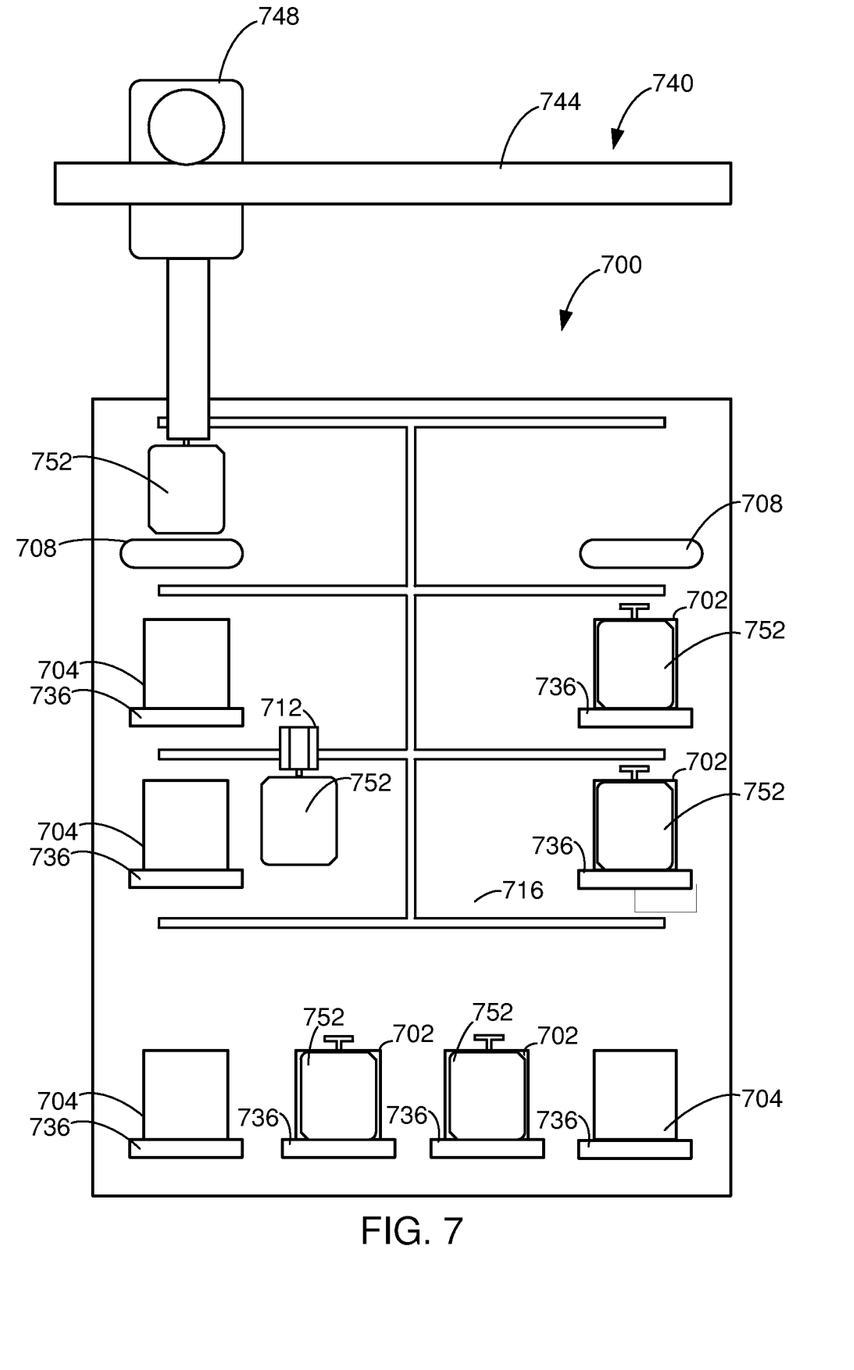
FIG. 7 is a schematic front view of an EFEM with a substrate cassette loading system in another embodiment.

FIG. 7 is a front view of an EFEM 700 in another embodiment with a wafer cassette loading system for docking wafer cassettes to the EFEM 700. In this embodiment, the EFEM 700 has eight ports, where each port comprises an aperture 702 large enough to allow passage of a wafer into the EFEM 700 and a door opener 704 covering the aperture. Each port has an associated cassette loader 736. In this example, when a wafer cassette 752 is on a cassette loader 736 and docked to the port, the door opener 704 is not visible, but the aperture 702 is visible, and when a wafer cassette 752 is not docked to a port, the door opener 704 is closed and visible, so that the aperture 702 is not visible. As shown in this example, there are three rows of ports, where the bottom row has four ports, the middle row has two ports and the top row has two ports. The loading system comprises two pickup/drop off shelves 708 and actuators comprising a robot 712 and a track 716 for guiding the robot 712. An overhead hoist transport system (OHT) 740 comprises a track 744 and an OHT car 748 for transporting and vertically placing and/or removing wafer cassettes 752 on and/or from the pickup/drop off shelves 708.

As shown in FIG. 7, a wafer cassette 752 is being loaded to or removed from a pickup/drop off shelf 708, where the robot 712 on a track 716 is transporting a wafer cassette 752.

Figure 8:
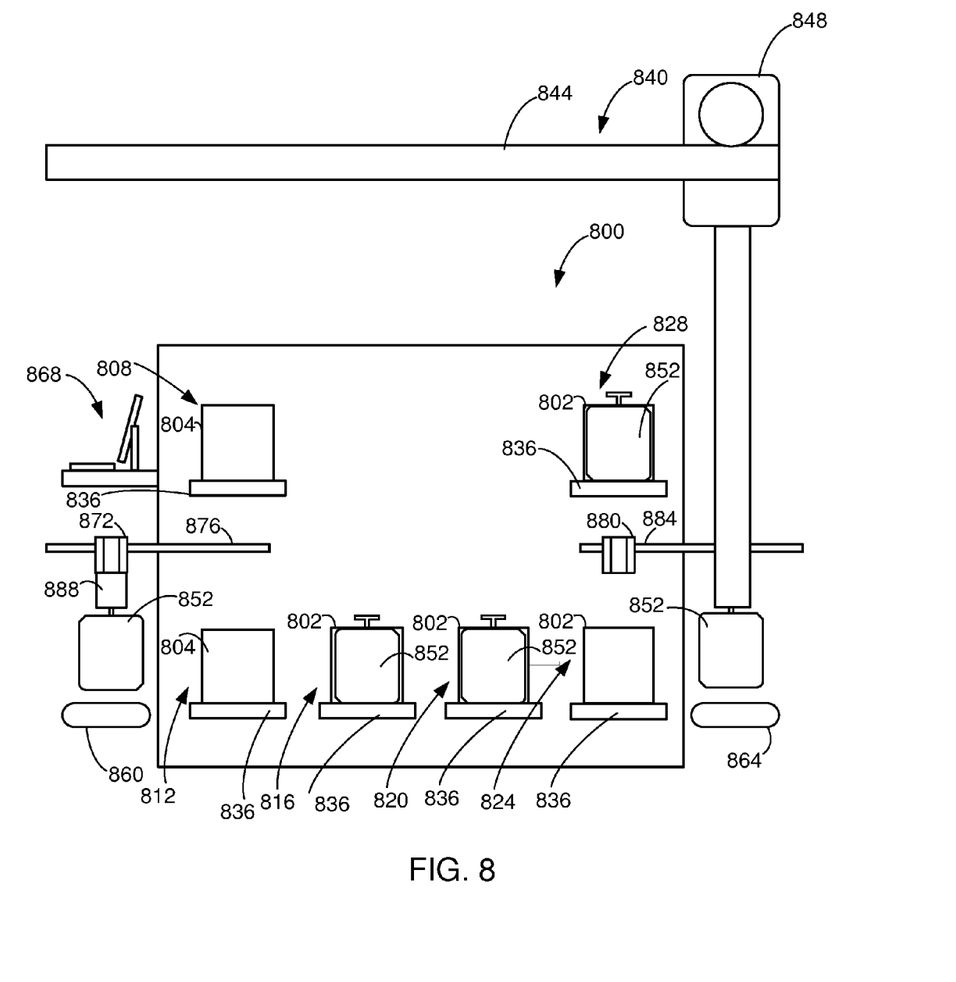
FIG. 8 is a schematic front view of an EFEM with a substrate cassette loading system in another embodiment.

FIG. 8 is a front view of an EFEM 800 in another embodiment with a FOUP loading system for docking FOUPs to the EFEM 800. The EFEM 800 has a plurality of ports, where each port comprises an aperture 802 large enough to allow passage of a wafer into the EFEM 800 and a door opener 804 covering the aperture when a FOUP is not docked to the port. In this example, the EFEM 800 comprises a first port 808, a second port 812, a third port 816, a fourth port 820, a fifth port 824, and a sixth port 828. Arrows are used to indicate each port, since each port comprises a door opener 804 and an aperture 802. As shown, the first port 808 is located vertically above the second port 812. In this example, the first port 808 is vertically aligned above the second port 812. The EFEM 800 further comprises a first drop off/pickup shelf 860 and a second drop off/pickup shelf 864, which are fixed. A first loader robot 872 on a first track 876 is able to transport a FOUP 852 between the first drop off/pickup shelf 860 and a cassette loader 836 for the second port 812. A second loader robot 888 on a second track 884 is able to transport a FOUP 852 between the second drop off/pickup shelf 864 and a cassette loader 836 for the fifth port 824.

An overhead hoist transport system (OHT) 840 comprises a track 844 and an OHT car 848 for transporting and vertically placing a FOUP 852. As shown, the location of the car 848 and the cassette loaders 836 allows the OHT 840 to place a FOUP 852 on the second drop off/pick up shelf 864. The OHT 840 both loads a FOUP 852 with preprocessed wafers on the cassette loaders 836 and first and second drop off/pickup shelves 860, 864 and removes a FOUP 852 with processed wafers from the cassette loaders 836 and first and second drop off/pickup shelves 860, 864. In this example, the first loader robot 872 is loading a FOUP 852 on the first drop off/pick shelf 860 using a telescoping arm 888. In this embodiment a control panel 868 or other features are on at least one side of the EFEM 800, making the width of the footprint of the EFEM wider.

In these various embodiments, the EFEM has a plurality of ports, where the ports have at least two different vertical heights. Actuators are used to allow an OHT to load the substrate cassettes to the different vertically displaced ports. In some of the above embodiments, the cassette loaders are used to move the substrate cassettes. In other embodiments, another actuator is used to move the substrate cassettes. Other embodiments may be provided. The vertically displaced loading port concept relies on a mechanized solution to enable loading of FOUPs dropped off by OHT to all load ports. The concept includes both the mechanized ability to transfer the FOUP and/or the mechanized ability for the load port itself to move. In another embodiment, the substrate cassette loading system with vertically displaced ports may be added to an existing cassette loading system to increase the number of ports for an existing system. Such systems for being added to an existing cassette loading system may have a single port on the top and a single port on the bottom. In other embodiments, a row of a plurality of ports may form a top row and a row of a plurality of ports may form a bottom row.

Various embodiments may have various actuators for moving either the substrate cassettes, cassette loaders, or both. Such actuators may be moving shelves, conveyors, cranes, robotic arms, track systems such as a car on a rail, telescoping rods, rack and pinion systems, piston driven systems, or other types of actuators.

While this disclosure has been described in terms of several preferred embodiments, there are alterations, permutations, modifications, and various substitute equivalents, which fall within the scope of this disclosure. It should also be noted that there are many alternative ways of implementing the methods and apparatuses of the present disclosure. It is therefore intended that the following appended claims be interpreted as including all such alterations, permutations, and various substitute equivalents as fall within the true spirit and scope of the present disclosure.

What is claimed is:

1. A substrate cassette loading system for docking substrate cassettes to a substrate processing system, comprising
a plurality of ports for passing substrates into the substrate processing system, wherein a first port of the plurality of ports is vertically above a second port of the plurality of ports and wherein the first port is in a row of upper ports and the second port is in a row of lower ports; and
a plurality of cassette loaders for providing substrate cassettes to the plurality of ports, comprising a first cassette loader for providing substrate cassettes to the first port and a second cassette loader for providing substrate cassettes to the second port, wherein at least one of the first cassette loader or second cassette loader is movable, wherein if the first cassette loader is movable the first cassette loader is movable horizontally along the row of upper ports and wherein if the second cassette loader is movable the second cassette loader is movable horizontally along the row of lower ports.

2. The substrate cassette loading system, as recited in claim 1, further comprising at least one cassette loader actuator for moving at least one cassette loader of the plurality of cassette loaders from a port of the plurality of ports.

3. The substrate cassette loading system, as recited in claim 2, wherein the substrate processing system comprises an overhead hoist transport, which vertically moves the substrate cassettes onto each of the plurality of cassette loaders, wherein in the first position, the overhead hoist transport loads a substrate cassette into the first cassette loader and in the second position, the overhead hoist transport loads a substrate cassette into the second cassette loader.

4. The substrate cassette loading system, as recited in claim 3, wherein the overhead hoist transport is in a first position for loading the first cassette loader and wherein the overhead hoist transport is in a second position for loading the second cassette loader.

5. The substrate cassette loading system, as recited in claim 4, wherein the at least one cassette loader actuator moves the second cassette loader.

6. The substrate cassette loading system, as recited in claim 3, wherein the overhead hoist transport is in a set position for loading the first cassette loader and the second cassette loader.

7. The substrate cassette loading system, as recited in claim 6, wherein the at least one cassette loader actuator moves the first cassette loader.

8. The substrate cassette loading system, as recited in claim 3, wherein each of the plurality of substrate cassettes is a front opening unified pod.

9. The substrate cassette loading system, as recited in claim 1, further comprising at least one substrate cassette actuator, which is able to load a first substrate cassette into a first cassette loader adjacent to the first port and is able to load a second substrate cassette into a second cassette loader adjacent to the second port.

10. The substrate cassette loading system, as recited in claim 9, further comprising at least one pickup/drop off shelf, wherein the at least one substrate cassette actuator is able to transport substrate cassettes to and from the at least one pickup/drop off shelf and a the first and second cassette loaders.

11. The substrate cassette loading system, as recited in claim 1, further comprising a robot arm which is able to access substrates in a substrate cassette at the first port and is able to access substrates in a substrate cassette at the second port.

12. A substrate cassette loading system for docking substrate cassettes to a substrate processing system, comprising
a plurality of ports for passing substrates into the substrate processing system, wherein a first port of the plurality of ports is vertically above a second port of the plurality of ports and wherein the first port is in a row of upper ports and the second port is in a row of lower ports;
a plurality of cassette loaders for docking substrate cassettes to the plurality of ports with a first cassette loader of the plurality of cassette loaders, which docks substrate cassettes to the first port and a second cassette loader of the plurality of cassette loaders, which docks substrate cassettes to the second port, wherein at least one of the first cassette loader or second cassette loader is movable, wherein if the first cassette loader is movable the first cassette loader is movable horizontally along the row of upper ports and wherein if the second cassette loader is movable the second cassette loader is movable horizontally along the row of lower ports; and
at least one cassette loader actuator, wherein the at least one cassette loader actuator moves either the first cassette loader or the second cassette loader, from a first position, where the first cassette loader is vertically aligned with the second cassette loader, to a second position where the first cassette loader is not vertically aligned with the second cassette loader.

13. The substrate cassette loading system, as recited in claim 12, wherein each of the plurality of substrate cassettes is a front opening unified pod.

14. A method for loading substrate cassettes to a substrate processing system, comprising:
providing a plurality of ports for passing substrates into the substrate processing system, wherein a first port of the plurality of ports is vertically above a second port of the plurality of ports' wherein the first port is in a row of upper ports and the second port is in a row of lower ports and a plurality of cassette loaders for docking substrate cassettes to the plurality of ports with a first cassette loader of the plurality of cassette loaders, which docks substrate cassettes to the first port and a second cassette loader of the plurality of cassette loaders, which docks substrate cassettes to the second port, wherein at least one of the first cassette loader or second cassette loader is movable, wherein if the first cassette loader is movable the first cassette loader is movable horizontally along the row of upper ports and wherein if the second cassette loader is movable the second cassette loader is movable horizontally along the row of lower ports;

loading substrate cassettes on the first cassette loader and the second cassette loader; and removing substrate cassettes from the first cassette loader and the second cassette loader.

15. The method as recited in claim 14, further comprising moving either the first cassette loader or the second cassette loader, from a first position, where the first cassette loader is vertically aligned with the second cassette loader, to a second position where the first cassette loader is not vertically aligned with the second cassette loader.

16. The method, as recited in claim 15, further comprising:

vertically loading a substrate cassette into the first cassette loader in the first position; and vertically loading a substrate cassette into the second cassette loader in the second position.

17. The method, as recited in claim 14, wherein the loading substrate cassettes, comprises:

placing a substrate cassette on a pickup/drop off shelf; and transporting the substrate cassette from the pickup/drop off shelf to either the first cassette loader or the second cassette loader.

18. The method, as recited in claim 14, further comprising:

removing by a robot a substrate from a cassette at the first port and transporting the wafer into the processing system; and removing by the robot a substrate from a cassette at the second port and transporting the wafer into the processing system.

19. The method as recited in claim 14, further comprising removing by a robot a substrate from a cassette at the first port and transporting the wafer into the processing system.

20. The method, as recited in claim 16, wherein the second position moves the second cassette loader on a side of the substrate processing system.

* * * * *